(12) United States Patent
Park

(10) Patent No.: US 8,558,104 B2
(45) Date of Patent: Oct. 15, 2013

(54) SOLAR CELL

(75) Inventor: Sang-Wook Park, Suwon-si (KR)

(73) Assignee: Samsung SDI Co., Ltd., Giheung-gu, Yongin-si, Gyeonggi-do (KR)

( * ) Notice: Subject to any disclaimer, the term of this patent is extended or adjusted under 35 U.S.C. 154(b) by 552 days.

(21) Appl. No.: 11/727,355

(22) Filed: Mar. 26, 2007

(65) Prior Publication Data

US 2007/0235075 A1   Oct. 11, 2007

(30) Foreign Application Priority Data

Apr. 6, 2006 (KR) .................. 10-2006-0031356

(51) Int. Cl.
*H01L 31/0224* (2006.01)

(52) U.S. Cl.
USPC .............. 136/256; 136/252; 136/255; 438/98

(58) Field of Classification Search
USPC .................................. 136/252–265
See application file for complete search history.

(56) References Cited

U.S. PATENT DOCUMENTS

| | | | |
|---|---|---|---|
| 4,838,952 A | 6/1989 | Dill et al. | |
| 5,017,243 A * | 5/1991 | Otsubo | 136/244 |
| 5,468,652 A * | 11/1995 | Gee | 438/98 |
| 6,143,976 A | 11/2000 | Endros | |
| 6,322,711 B1 * | 11/2001 | Chen | 216/16 |
| 6,384,317 B1 | 5/2002 | Kerschaver et al. | |
| 7,217,883 B2 | 5/2007 | Munzer | |
| 2004/0200520 A1* | 10/2004 | Mulligan et al. | 136/256 |
| 2004/0261839 A1* | 12/2004 | Gee et al. | 136/256 |
| 2005/0022857 A1* | 2/2005 | Daroczi et al. | 136/244 |
| 2005/0176164 A1 | 8/2005 | Gee et al. | |
| 2006/0021647 A1* | 2/2006 | Gui et al. | 136/252 |
| 2006/0060238 A1* | 3/2006 | Hacke et al. | 136/256 |
| 2006/0231130 A1* | 10/2006 | Sharps et al. | 136/243 |
| 2007/0039645 A1* | 2/2007 | Nagel | 136/261 |
| 2009/0211628 A1 | 8/2009 | Engelhart et al. | |

FOREIGN PATENT DOCUMENTS

| | | |
|---|---|---|
| CN | 1592972 | 3/2005 |
| DE | 10 2005 040 871 A1 | 10/2006 |
| EP | 1 872 411 B1 | 9/2008 |
| JP | 01181575 | 7/1989 |
| JP | 04015962 | 1/1992 |
| JP | 06037343 | 2/1994 |
| JP | 06-181323 | 6/1994 |
| JP | 11330517 | 11/1999 |

(Continued)

OTHER PUBLICATIONS

Transmitter letter and Japanese Office Action issued by Japanese Patent Office on Sep. 15, 2009 in the corresponding Japanese Patent Application No. 2007-066516.

(Continued)

*Primary Examiner* — Jennifer Michener
*Assistant Examiner* — Jayne Mershon
(74) *Attorney, Agent, or Firm* — Robert E. Bushnell, Esq.

(57) ABSTRACT

A solar cell includes: a semiconductor substrate having a first portion and a second portion; an emitter portion of the semiconductor substrate arranged on a front surface of the semiconductor substrate and extending to a rear surface of the first portion of the semiconductor substrate; a first electrode electrically connected to the emitter portion of the semiconductor substrate and arranged on the rear surface of the semiconductor substrate; and a second electrode electrically connected to the semiconductor substrate and arranged on the rear surface of the semiconductor substrate. The first portion of the semiconductor substrate is thinner than the second portion of the semiconductor substrate.

10 Claims, 4 Drawing Sheets

(56) References Cited

FOREIGN PATENT DOCUMENTS

| JP | 2005510885 A | | 4/2005 |
|---|---|---|---|
| JP | 2008537331 A | | 9/2006 |
| WO | WO 2005/034171 | * | 4/2005 |

OTHER PUBLICATIONS

European Office Action issued by European Patent Office on Jan. 24, 2011 corresponding to Korean Patent Application No. 2006-0031356.

Cited in the Japanese Notice of Allowance issued by JPO, date Mar. 29, 2011, corresponding to Japanese Patent Application No. 2007-066516, together with Request for Entry.

European Office action issued by European Patent Office on Jan. 16, 2012, corresponding to EP 07 105 715.2-1528 is attached herewith.

Korean Notice of Allowance issued by KIPO on Nov. 13, 2012 in connection with Korean Patent Application No. 10-2006-0031356 and Request for Entry of the Accompanying Office Action attached herewith.

* cited by examiner

SOLAR CELL

CLAIM OF PRIORITY

This application makes reference to, incorporates the same herein, and claims all benefits accruing under 35 U.S.C.§119 from an application for SOLAR CELL earlier filed in the Korean Intellectual Property Office on 6 Apr. 2006 and there duly assigned Serial No. 10-2006-0031356.

BACKGROUND OF THE INVENTION

1. Field of the Invention

The present invention relates to a solar cell, and more particularly, the present invention relates to a solar cell having an improved structure.

2. Description of the Related Art

A solar cell generates electric energy using solar energy. The solar cell is eco-friendly and has an infinite energy source and a long life span. The solar cell includes a silicon solar cell and a dye-sensitized solar cell.

The silicon solar cell includes a semiconductor substrate and an emitter layer that have different conductive types to form a PN junction, a first electrode electrically connected to the emitter layer, and a second electrode electrically connected to the semiconductor substrate.

The first electrode is formed on a front surface of the semiconductor substrate and the second electrode is formed on a rear surface of the semiconductor substrate. However, in such a solar cell, since shading loss due to the first electrode is significantly large, of the order of 10%, the efficiency of the solar cell can be reduced.

In order to reduce the shading loss, a rear-electrode type solar cell, in which a first electrode is formed on a rear surface of a semiconductor substrate, has been suggested. In such a rear-electrode type solar cell, charges generated in a PN junction must move into the first electrode by a relatively large distance. Accordingly, re-coupling probability such as impurity-crystal coupling may increase and thus electrical loss may increase.

In order to prevent the electrical loss, a non-defective semiconductor substrate must be used. However, since it is substantially impossible to manufacture the non-defective semiconductor substrate, economical efficiency is low.

In the rear-electrode type solar cell, the electrical loss increases as the movement distance of the charges increases. Accordingly, in spite of reducing the shading loss, efficiency cannot be significantly improved.

SUMMARY OF THE INVENTION

In order to solve the aforementioned problem, the present invention provides a rear-electrode solar cell which is capable of simultaneously reducing shading losses and electrical losses.

According to an aspect of the present invention, a solar cell is provided including: a semiconductor substrate including a first portion and a second portion; an emitter portion arranged on a front surface of the semiconductor substrate and extending to a rear surface of the semiconductor substrate in the first portion; a first electrode electrically connected to the emitter portion and arranged on the rear surface of the semiconductor substrate; and a second electrode electrically connected to the semiconductor substrate and arranged on the rear surface of the semiconductor substrate; the thickness of the first portion is less than that of the second portion.

The first electrode may be arranged in the first portion and the second electrode arranged in the second portion. A step difference may be arranged at a boundary between the first portion and the second portion of the semiconductor substrate.

A concave portion may be arranged in a rear surface of the semiconductor substrate in correspondence with the first portion. The first electrode may be arranged in the concave portion.

A through-hole connected to the first electrode may be arranged in the first portion and the emitter portion extending to the rear surface through the through-hole.

BRIEF DESCRIPTION OF THE DRAWINGS

A more complete appreciation of the present invention and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Hereinafter, a solar cell according to an embodiment of the present invention is described in detail with reference to the attached drawings.

Figure 1:
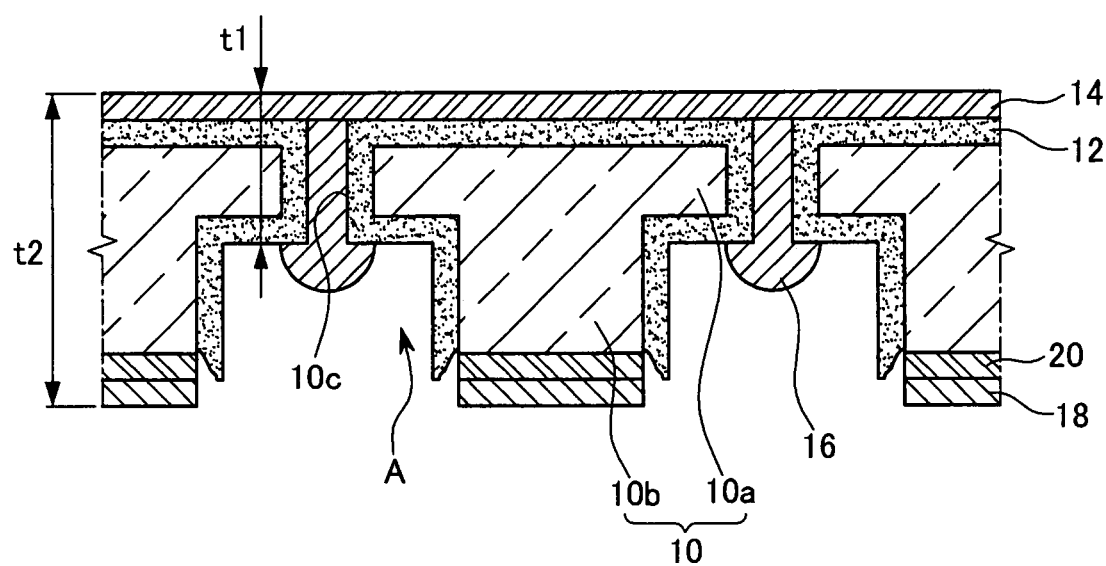
FIG. 1 is a partial cross-sectional view of a solar cell according to an embodiment of the present invention.

FIG. 1 is a partial cross-sectional view of a solar cell according to an embodiment of the present invention.

Referring to FIG. 1, the solar cell according to the present embodiment includes a semiconductor substrate 10, an emitter portion 12 formed in the semiconductor substrate 10, a reflection preventing layer 14 formed on a front surface of the semiconductor substrate 12, and a first electrode 16 and a second electrode 18 formed on a rear surface of the semiconductor substrate 10.

In the present embodiment, the semiconductor substrate 10 is formed of silicon and may be of a p-type. However, the present invention is not limited thereto. That is, the semiconductor substrate may be formed of various semiconductor materials other than silicon and may be of an n-type.

In the present embodiment, the semiconductor substrate 10 includes a first portion 10a and a second portion 10b. The first portion 10a is a portion in which the emitter portion 12 extends from the front surface to the rear surface of the semiconductor substrate 10, that is, the emitter portion 12 is formed even on the rear surface. The second portion 10b is a portion in which the emitter portion 12 is formed only on the front surface of the semiconductor substrate 10. A through-hole 10c for connecting the emitter portion 12 and the first electrode 16 formed on the rear surface of the semiconductor substrate 10 is formed in the first portion 10a.

In the present embodiment, a concave portion A is formed in the rear surface of the semiconductor substrate 10 in correspondence with the first portion 10a to form a step difference at a boundary between the first portion 10a and the second portion 10b. By such a step difference, the thickness t1 of the first portion 10a is smaller than the thickness t2 of the second portion 10b.

The n-type emitter portion 12 is formed in the semiconductor substrate 10. The conductive type of the emitter portion 12 must be opposite to that of the semiconductor substrate 10. Accordingly, when the semiconductor substrate is of an n-type, the emitter portion is of a p-type. In the present embodiment, the emitter portion 12 is formed on the front surface of the semiconductor 10 to form a PN junction together with the semiconductor substrate 10. The emitter portion 12 extends to the rear surface of the semiconductor substrate 10 along the through-hole 10c in the first portion 10a.

The reflection preventing layer 14 is formed on a portion of the emitter portion 12 formed on the front surface of the semiconductor substrate 10. The reflection preventing layer 14 suppresses incident solar light from being reflected and prevents electrons from being lost at the surface of the substrate. That is, it is possible to prevent the loss of the electrons at the surface of the substrate due to dangling bonds.

The first electrode 16 electrically connected to the emitter portion 12 and the second electrode 18 electrically connected to the semiconductor substrate are formed on the rear surface of the semiconductor substrate 10. In the present embodiment, since the first electrode 16 and the second electrode 18 are formed on the rear surface of the semiconductor substrate 10 to reduce shading losses, it is possible to improve the efficiency of the solar cell.

The first electrode 16 is formed in the concave portion A of the first portion 10a. At this time, since the first electrode 16 is in contact with the emitter portion 12 formed on the rear surface of the first portion 10a and the through-hole 10c is filled with the first electrode 16, the first electrode 16 is electrically connected to the emitter portion 12 formed on the front surface of the first portion 10a. The first electrode 16 is formed of a conductive material, such as silver (Ag) or copper (Cu) and may have a stripe shape.

The second electrode 18 may be formed on the entire rear surface of the second portion 10b. The second electrode 18 may be formed of a conductive material, such as aluminum (Al). A rear field layer 20 is formed on the rear surface of the semiconductor substrate 10 in correspondence with the second electrode 18. The rear field layer 20 prevents photo-excited electrons from moving into the rear surface of the semiconductor substrate 10.

When light enters the solar cell, hole-electron pairs generated by the photoelectric effect are separated, electrons are concentrated at the n-type emitter portion 12 and holes are concentrated at the p-type semiconductor substrate 10, thereby generating a potential difference. By this potential difference, current flows in the first electrode 16 and the second electrode 18 and thus the solar cell operates.

Electrons in the emitter portion 12 formed on the front surface of the semiconductor substrate 10 move into the first electrode 16 formed on the rear surface of the semiconductor substrate 10. In the present embodiment, it is possible to reduce the movement distance of charges by setting the thickness of the first portion 10a to be smaller than that of the second portion 10b. Accordingly, it is possible to reduce electrical losses by preventing re-coupling from occurring when moving the charges into the electrode. As a result, it is possible to improve the efficiency of the solar cell.

In the present invention, the thicknesses of the first portion and the second portion are set to be different from each other by providing a concave portion in the rear surface of the semiconductor substrate. Accordingly, the present invention is applicable to solar cells having various structures and a method of manufacturing the solar cells.

Hereinafter, a method of manufacturing the solar cell according to the embodiment of the present invention is described in detail below with reference to FIGS. 2A and 2I.

FIG. 2A to FIG. 2I are cross-sectional views of a method of manufacturing the solar cell of FIG. 1.

Figure 2A:
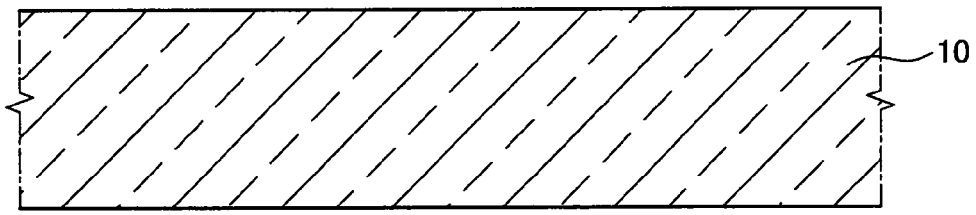
FIG. 2A to FIG. 2I are cross-sectional views of a method of manufacturing the solar cell of FIG. 1.

First, as shown in FIG. 2A, a p-type semiconductor substrate 10 is formed of silicon. However, the present invention is not limited thereto. That is, an n-type semiconductor substrate or a semiconductor substrate formed of various semiconductor materials other than silicon may be used.

Figure 2B:
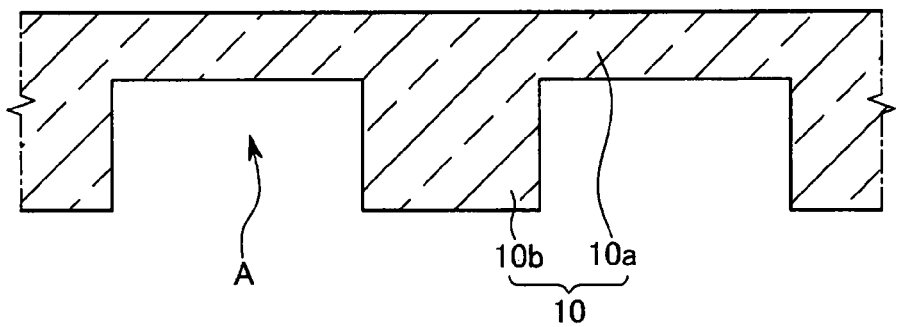

Subsequently, as shown in FIG. 2B, the concave portion A is formed in the rear surface of the semiconductor substrate 10 in correspondence with the first electrode (reference numeral 16 of FIG. 2H) which will be formed later. Accordingly, the first portion 10a is thinner than the semiconductor substrate and the second portion 10b is the same thickness as that of the semiconductor substrate. The concave portion A may be formed by various methods, such as physical/mechanical methods and chemical methods.

Figure 2C:
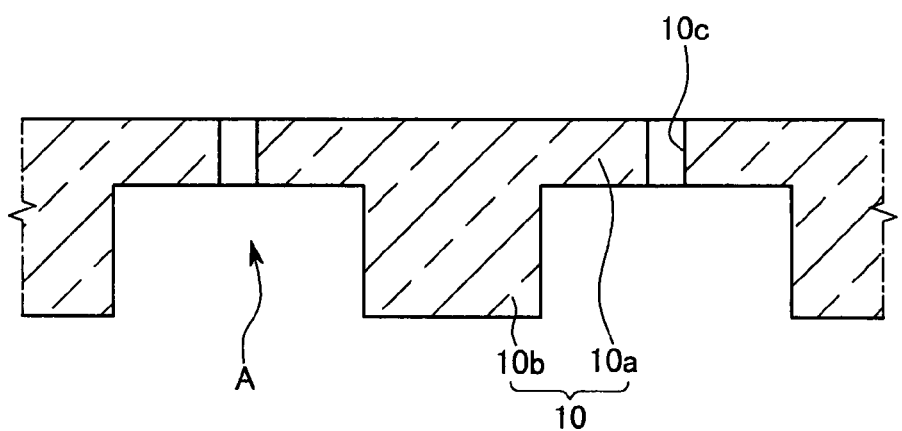

Subsequently, as shown in FIG. 2C, a through-hole 10c is formed in the first portion 10a using a laser. A damaged portion of the semiconductor substrate 10 is removed using an alkali aqueous solution or a mixed acid solution. Since irregularities are formed in the surface of the semiconductor substrate 10, it is possible to reduce the solar light losses.

Figure 2D:
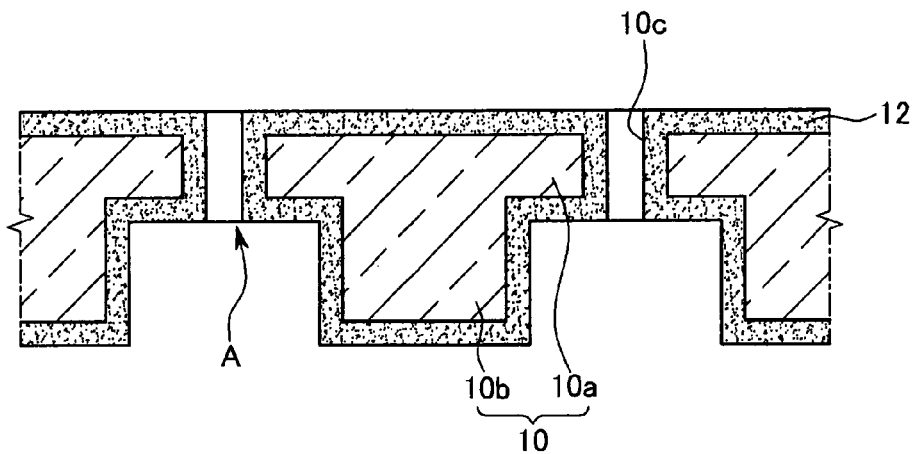

Subsequently, as shown in FIG. 2D, a dopant is doped into the semiconductor substrate 10 to form the n-type emitter portion 12. The present invention is not limited thereto. The conductivity type of the emitter portion 12 must be opposite to that of the semiconductor substrate 10. Accordingly, when an n-type semiconductor substrate is used, a p-type emitter portion is needed.

The emitter portion 12 is formed on the front surface of the semiconductor substrate 10, the inner surface of the through-hole 10c and the side surface and the rear surface of the semiconductor substrate 10. The doping may be performed by various methods, such as a high-temperature diffusion method and the like.

After doping, it is preferable that Phosphorous Silicate Glass (PSG), which is formed unnecessarily, is removed using a hydrofluoric acid aqueous solution.

Figure 2E:
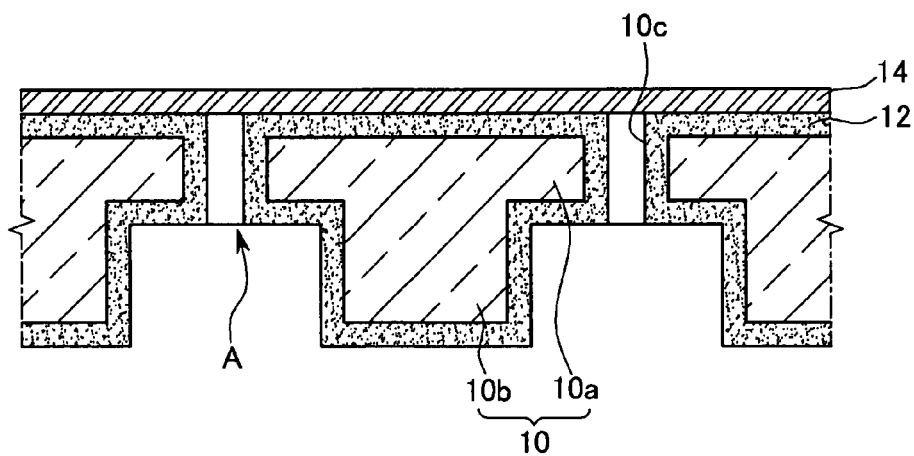

Next, as shown in FIG. 2E, the reflection preventing layer 14 is formed on the emitter portion 12 formed on the front surface of the semiconductor substrate 10. The reflection preventing layer 14 may be a silicon nitride layer, a silicon oxide layer or a titanium oxide layer. The reflection preventing layer 14 may be formed by various methods, such as a plasma chemical vapor deposition method, an electron beam deposition method, a screen printing method and a spray method.

Figure 2F:
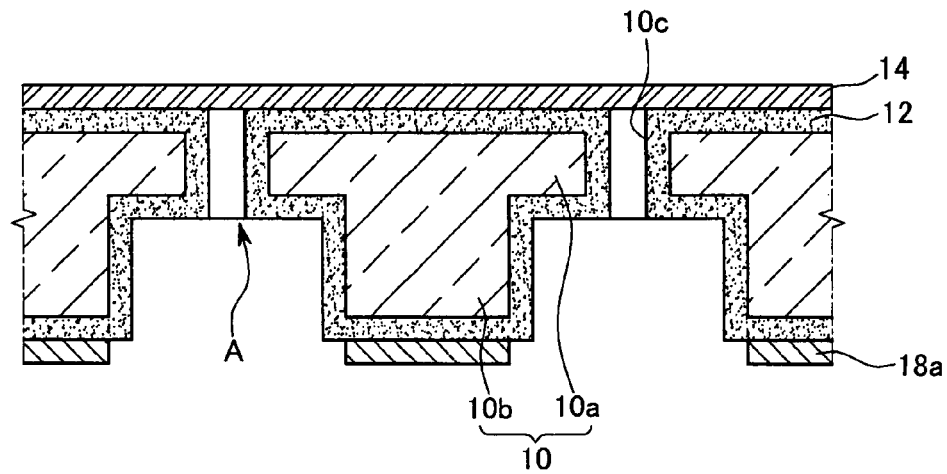

Subsequently, as shown in FIG. 2F, a paste 18a including aluminum is coated on the rear surface of the second portion 10b by a printing method and is dried. Although the paste 18a including aluminum is used in the present embodiment, various conductive materials may be included.

Figure 2G:
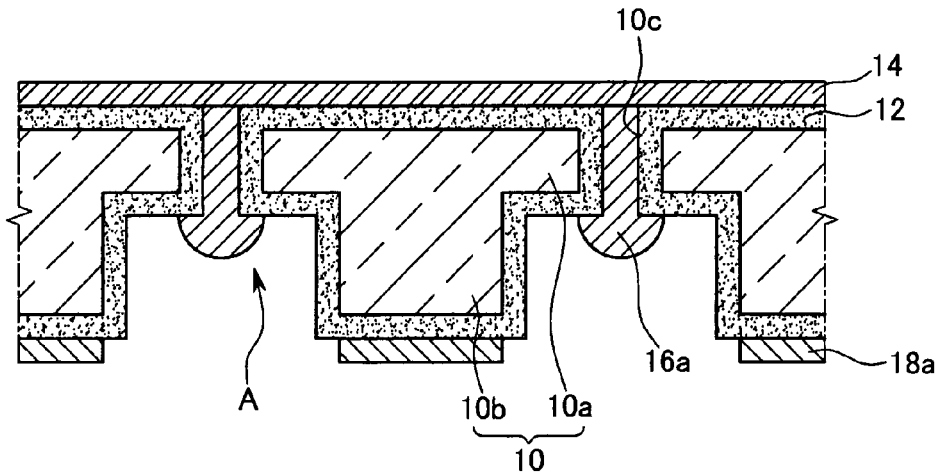

Next, as shown in FIG. 2G, a paste 16a including silver or copper is coated on the rear surface of the first portion 10a by an inkjet method or a dispensing method and is dried. Although the paste 16a including silver or copper is used in the present embodiment, various other conductive materials may be included.

Figure 2H:
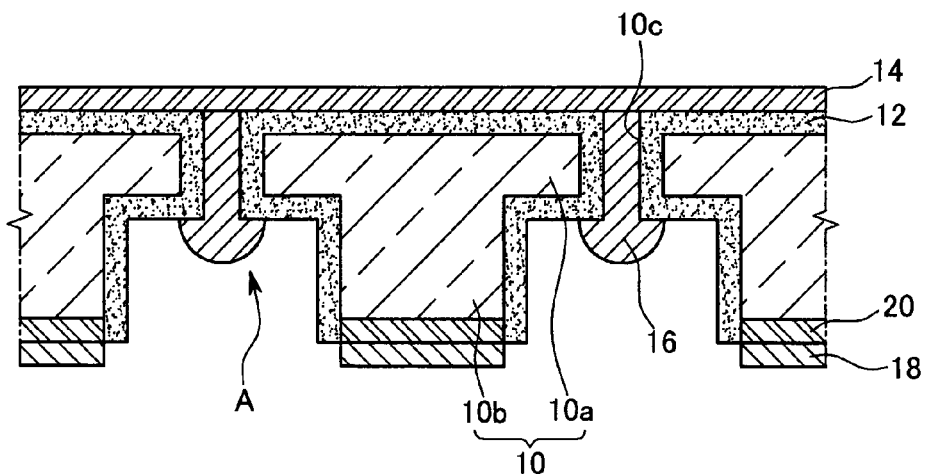

Subsequently, as shown in FIG. 2H, the first electrode 16, the second electrode 18 and the rear field layer 20 are formed by a heat treatment.

That is, the paste (reference numeral 18a of FIG. 2G) including aluminum is heated to form the second electrode 18 electrically connected to the semiconductor substrate 10 and aluminum is diffused into the rear surface of the semiconductor substrate 10 by a predetermined thickness to form the rear field layer 20 while removing the emitter portion 12. The paste 16a including silver or copper is heated to form the first electrode 16 electrically connected to the emitter portion 12.

Figure 2I:
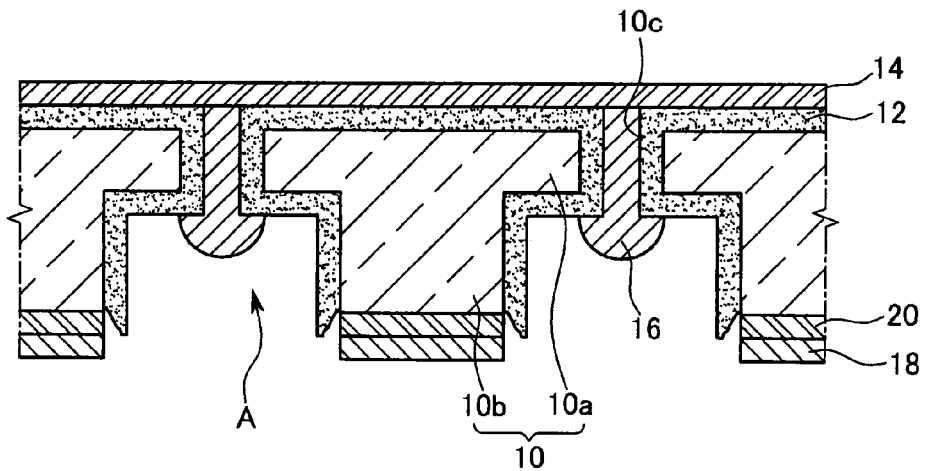

Subsequently, as shown in FIG. 2I, the emitter portion 12 formed on the rear surface of the first portion 10a and the second electrode 18 formed on the rear surface of the second portion 10b are disconnected using a laser.

In the manufacturing method, the order of the steps can be modified. Such modifications are within the scope of the present invention.

Although an electrode is not formed on the front surface of the semiconductor substrate in the above-described embodiment, the present invention is not limited thereto. An additional electrode having a small line width can be formed so as to easily collect electrons and such a modification is within the scope of the present invention. A passivation layer formed of silicon nitride may be further formed on the rear surface of the first portion and such a modification is within the scope of the present invention.

Although the exemplary embodiments and the modified examples of the present invention have been described, the present invention is not limited to the embodiments and examples, but may be modified in various ways without departing from the scope of the appended claims.

According to a solar cell of the present invention, since the thickness of a first portion of a semiconductor substrate, in which an emitter portion extends from a front surface to a rear surface of the semiconductor substrate, is set to be smaller than that of a second portion, it is possible to reduce the movement distance of charges. Accordingly, it is possible to prevent re-coupling from occurring when moving the charges into the electrode. Since both a first electrode and a second electrode are formed on the rear surface of the semiconductor substrate, it is possible to reduce the loss of solar light.

That is, in a rear-electrode solar cell in which a first electrode and a second electrode are formed on a rear surface of a semiconductor substrate, it is possible to reduce electrical losses and to improve the efficiency of the solar cell.

The present invention has a simple structure in which a concave portion is formed in the rear surface of a semiconductor substrate and is thus applicable to various solar cells and a method of manufacturing the solar cell.

What is claimed is:

1. A solar cell, comprising:
    a semiconductor substrate comprising a first portion penetrated by a through-hole and a second portion thicker than the first portion, the semiconductor substrate comprising a common front surface and a rear surface of the second portion which is disposed opposite to the common front surface, the common front surface connecting the rear surface of the second portion with a side surface of the through-hole, a rear surface of the first portion and a side surface of the second portion, with the rear surface of the first portion being closer to the common front surface in comparison with the rear surface of the second portion;
    the through-hole connecting the common front surface of the semiconductor substrate to the rear surface of the first portion of the semiconductor substrate;
    an emitter formed on the common front surface of the semiconductor substrate, the side surface of the through-hole, the rear surface of the first portion of the semiconductor substrate and extending along the side surface of the second portion of the semiconductor substrate;
    a first electrode made of metal filling up the through-hole, the first electrode electrically extending, in contact with the emitter, from a front surface of the emitter, the first electrode ending at a surface area of the emitter disposed on the rear surface of the first portion of the semiconductor substrate via said through-hole without being disposed on a surface area of the emitter disposed on the side and rear surfaces of the second portion of the semiconductor substrate, a front surface of the first electrode being flush with the front surface of the emitter, with the first electrode being different from the emitter;
    a reflection preventing layer disposed over the front surface of the emitter and the front surface of the first electrode; and
    a second electrode electrically disposed on an entirety of the rear surface of the second portion of the semiconductor substrate and disconnected from the emitter, the second electrode being physically spaced apart from the emitter.

2. The solar cell as set forth in claim 1, further comprising a rear field layer formed between the second electrode and the rear surface of the second portion of the semiconductor substrate, the rear field layer preventing photo-excited electrons from moving into the rear surface of the second portion of the semiconductor substrate.

3. The solar cell as set forth in claim 1, the first and second portions of the semiconductor substrate forming a stepped shape.

4. The solar cell as set forth in claim 1, the emitter formed on the front surface of the semiconductor substrate forming a PN junction together with the semiconductor substrate.

5. The solar cell as set forth in claim 4, the emitter extending to the rear surface of the second portion of the semiconductor substrate.

6. The solar cell as set forth in claim 1, the semiconductor substrate being a p-type semiconductor substrate.

7. The solar cell as set forth in claim 1, the emitter being an n-type emitter.

8. The solar cell as set forth in claim 1, the first electrode being formed of silver (Ag) or copper (Cu).

9. The solar cell as set forth in claim 1, the first electrode having a stripe shape.

10. The solar cell as set forth in claim 1, the second electrode being formed of aluminum (Al).

* * * * *